United States Patent
Braun et al.

(10) Patent No.: US 10,698,063 B2
(45) Date of Patent: Jun. 30, 2020

(54) MOTION ARTIFACT REDUCTION OF MAGNETIC RESONANCE IMAGES WITH AN ADVERSARIAL TRAINED NETWORK

(71) Applicant: Siemens Healthcare GmbH, Erlangen (DE)

(72) Inventors: Sandro Braun, Karlsruhe (DE); Boris Mailhe, Plainsboro, NJ (US); Xiao Chen, Princeton, NJ (US); Benjamin L. Odry, West New York, NJ (US); Pascal Ceccaldi, Princeton, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 127 days.

(21) Appl. No.: 16/008,086

(22) Filed: Jun. 14, 2018

(65) Prior Publication Data

US 2019/0128989 A1    May 2, 2019

Related U.S. Application Data

(60) Provisional application No. 62/580,076, filed on Nov. 1, 2017.

(51) Int. Cl.
*G01R 33/565* (2006.01)
*G06T 5/00* (2006.01)
(Continued)

(52) U.S. Cl.
CPC ......... *G01R 33/56509* (2013.01); *G06N 3/08* (2013.01); *G06N 5/046* (2013.01);
(Continued)

(58) Field of Classification Search
CPC combination set(s) only.
See application file for complete search history.

(56) References Cited

U.S. PATENT DOCUMENTS

| 10,387,765 B2 * | 8/2019 | Mailhe | G06N 3/084 |
| 2007/0253599 A1 * | 11/2007 | White | G01R 33/56509 |
| | | | 382/107 |

(Continued)

FOREIGN PATENT DOCUMENTS

| EP | 3477583 A1 * | 5/2019 | G06T 5/003 |
| WO | WO-2019086337 A1 * | 5/2019 | G16H 40/63 |

OTHER PUBLICATIONS

Alhamud A, Tisdall MD, Hess AT, Hasan KM, Meintjes EM, Van Der Kouwe AJW. "Volumetric navigators for real-time motion correction in diffusion tensor imaging". Magn Reson Med. 2012;68:1097-1108. doi:10.1002/mrm.23314.

(Continued)

*Primary Examiner* — Tsung Yin Tsai (57) ABSTRACT

Systems and methods are provided for correcting motion artifacts in magnetic resonance images. An image-to-image neural network is used to generate motion corrected magnetic resonance data given motion corrupted magnetic resonance data. The image-to-image neural network is coupled within an adversarial network to help refine the generated magnetic resonance data. The adversarial network includes a generator network (the image-to-image neural network) and a discriminator network. The generator network is trained to minimize a loss function based on a Wasserstein distance when generating MR data. The discriminator network is trained to differentiate the motion corrected MR data from motion artifact free MR data.

17 Claims, 8 Drawing Sheets

(51) Int. Cl.
*G06N 5/04* (2006.01)
*G06T 7/20* (2017.01)
*G06N 3/08* (2006.01)

(52) U.S. Cl.
CPC ............... *G06T 5/003* (2013.01); *G06T 7/20* (2013.01); *G06T 2207/10088* (2013.01); *G06T 2207/20081* (2013.01)

(56) References Cited

U.S. PATENT DOCUMENTS

| | | | | |
|---|---|---|---|---|
| 2011/0201916 | A1* | 8/2011 | Duyn | G01R 33/56509 600/410 |
| 2017/0032538 | A1* | 2/2017 | Ernst | G06K 9/6256 |
| 2017/0372155 | A1* | 12/2017 | Odry | G06K 9/03 |
| 2017/0372193 | A1* | 12/2017 | Mailhe | G06N 3/0472 |
| 2018/0240235 | A1* | 8/2018 | Mazo | G16H 50/50 |
| 2019/0108441 | A1* | 4/2019 | Thibault | G06N 3/08 |

OTHER PUBLICATIONS

Arjovsky, Martin, Soumith Chintala, and Léon Bottou. "Wasserstein GAN." arXiv:1701.07875 [Cs, Stat], Jan. 26, 2017. http://arxiv.org/abs/1701.07875.

David C. Van Essen, Stephen M. Smith, Deanna M. Barch, Timothy E.J. Behrens, Essa Yacoub, Kamil Ugurbil, "For the WU-Minn HCP Consortium. (2013). The WU-Minn Human Connectome Project: An overview." NeuroImage 80 (2013):62-79.

Gallichan D, Marques JP, Gruetter R. "Retrospective correction of involuntary microscopic head movement using highly accelerated fat image navigators (3D FatNavs) at 7T" Magn Reson Med. 2015;1039:1030-1039. doi:10.1002/mrm.25670.

Haskell M., Cauley S., Wald L. "Retrospective motion correction of head rotations in 2D RARE brain images using Targeted Motion Estimation and Reduction (TAMER)", Proc. Intl. Soc. Mag. Reson. Med 25 (2017).

Isola, Phillip, Jun-Yan Zhu, Tinghui Zhou, and Alexei A. Efros. "Image-to-Image Translation with Conditional Adversarial Networks." arXiv:1611.07004 [Cs], Nov. 21, 2016. http://arxiv.org/abs/1611.07004.

Jégou, Simon, Michal Drozdzal, David Vazquez, Adriana Romero, and Yoshua Bengio. "The One Hundred Layers Tiramisu: Fully Convolutional DenseNets for Semantic Segmentation." arXiv Preprint arXiv:1611.09326, 2016. https://arxiv.org/abs/1611.09326.

Kingma, Diederik P., and Jimmy Ba. "Adam: A Method for Stochastic Optimization." arXiv:1412.6980 [Cs], Dec. 22, 2014. http://arxiv.org/abs/1412.6980.

Loktyushin A, Nickisch H, Pohmann R, Schölkopf B. "Blind multirigid retrospective motion correction of MR images." Magn Reson Med. 2015;73(4):1457-1468. doi:10.1002/mrm.25266.

Maclaren J, Armstrong BSR, Barrows RT, et al. Measurement and Correction of Microscopic Head Motion during Magnetic Resonance Imaging of the Brain. PLoS One. 2012;7(11):3-11. doi:10.1371/journal.pone.0048088.

Wang, Z., A.C. Bovik, H.R. Sheikh, and E.P. Simoncelli. "Image Quality Assessment: From Error Visibility to Structural Similarity." IEEE Transactions on Image Processing 13, No. 4 (Apr. 2004): 600-612. https://doi.org/10.1109/TIP.2003.819861.

\* cited by examiner

MOTION ARTIFACT REDUCTION OF MAGNETIC RESONANCE IMAGES WITH AN ADVERSARIAL TRAINED NETWORK

CROSS REFERENCE TO RELATED APPLICATIONS

This application claims the benefit of U.S. Provisional Application No. 62/580,076, filed Nov. 1, 2017, which is hereby incorporated by reference in its entirety.

FIELD

The present embodiments relate to medical image processing, such as image processing for correcting motion artifacts in magnetic resonance images.

BACKGROUND

Image quality in magnetic resonance imaging (MRI) is considerably affected by motion. MRI scans may acquire data over a prolonged period of time. Due to the time it takes to perform the scan, MRI scans may capture many different types of movements, such as involuntary movements, cardiac and respiratory motion, vessel pulsation, and blood flow among other movements. Motion induced effects, e.g. artifacts, in MRI potentially include a combination of blurring of sharp contrast or object edges, ghosting originating from moving structures, signal loss due to spin dephasing or undesired magnetization evolution, or appearance of undesired strong signals among other artifacts. Motion is one of the most common sources of artifacts in MRI. The artifacts may lead to misinterpretations in the images and a subsequent loss in diagnostic quality.

Many techniques are used to prevent or suppress motion artifacts. If motion can be avoided, then the effects may be avoided. Rigid structures, sedation, and breath-holding among other techniques may be used to prevent movement. Faster acquisition may also be used to shorten the acquisition time of magnetic resonance (MR) data and therefore suppress the motion artifacts. Motion artifacts may also be removed or corrected when processing the MRI scan data. MRI navigators or markers may be used that infer or identify the motion of the subject using measurements or identifiers in the MRI data.

These techniques provide a first line of defense against motion artifacts but do not completely prevent artifacts from occurring. Additionally, the preventive techniques may be performed when acquiring the image data. When subsequently viewed, any motion artifacts may be unable to be corrected or may require performing an additional scan (for example, requiring a patient to make an additional trip to a medical facility and undergo another scanning procedure).

SUMMARY

By way of introduction, the preferred embodiments described below include methods and systems for automatically reducing motion artifacts in MR images using a machine learnt neural network that is trained using an adversarial process. The neural network is trained by using a feedback mechanism provided by a discriminator network. The feedback mechanism uses a loss metric calculated as a function of a Wasserstein distance.

In a first aspect, a method is provided for reducing motion artifact in a magnetic resonance imaging system. A patient is scanned by the magnetic resonance imaging system to acquire magnetic resonance data. The magnetic resonance data is input to a machine learnt generator network that is trained as an image-to-image network by a value function based on a Wasserstein distance to generate motion corrected MR data given motion corrupted input data. The machine learnt generator network generates first motion corrected MR data from the input magnetic resonance data. The first motion corrected MR data is displayed as an image.

In a second aspect, a method is provided for training a first neural network to generate motion corrected MR data. First motion corrupted MR data is input to the first neural network. First motion corrected MR data is generated by the first neural network. The first motion corrected MR data is input to a second neural network. The second neural network evaluates the first motion corrected MR data as a function of how similar the first motion corrected MR data is to a plurality of ground truth MR data. The first neural network is adjusted based on the evaluation. Second motion corrupted MR data is input to the first neural network. The process is repeated until the second neural network is unable to distinguish an input motion corrected MR data from an image of the plurality of ground truth images.

In a third aspect, a system is provided for motion artifact correction of magnetic resonance images. The system includes a magnetic resonance system, a generator network, a memory, and a display. The magnetic resonance system is configured to acquire MR data for a patient, wherein the MR data includes at least one or more motion artifacts. The generator network is trained with a discriminator network and a critic function based on a Wasserstein distance to generate motion corrected MR data when the MR data that includes one or more motion artifacts. The memory is configured to store the generator network as trained. The display is configured to display the motion corrected MR data from the generator network.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION

An adversarial training approach is used to correct motion artifacts in magnetic resonance images. An image-to-image neural network is used to generate motion corrected images given motion corrupted input images. The image-to-image neural network is coupled within an adversarial network to help refine the generated MR data. The adversarial network includes a generator network (the image-to-image neural network) and a discriminator network. The generator network is trained to minimize a loss function when generating MR data. The discriminator network is trained to differentiate motion corrected MR data from motion artifact free MR data. The output of the discriminator network is a classification and a gradient that is used to calculate the loss function for the generator network. The gradient for the discriminator network is calculated as a function of a Wasserstein distance.

Figure 1:
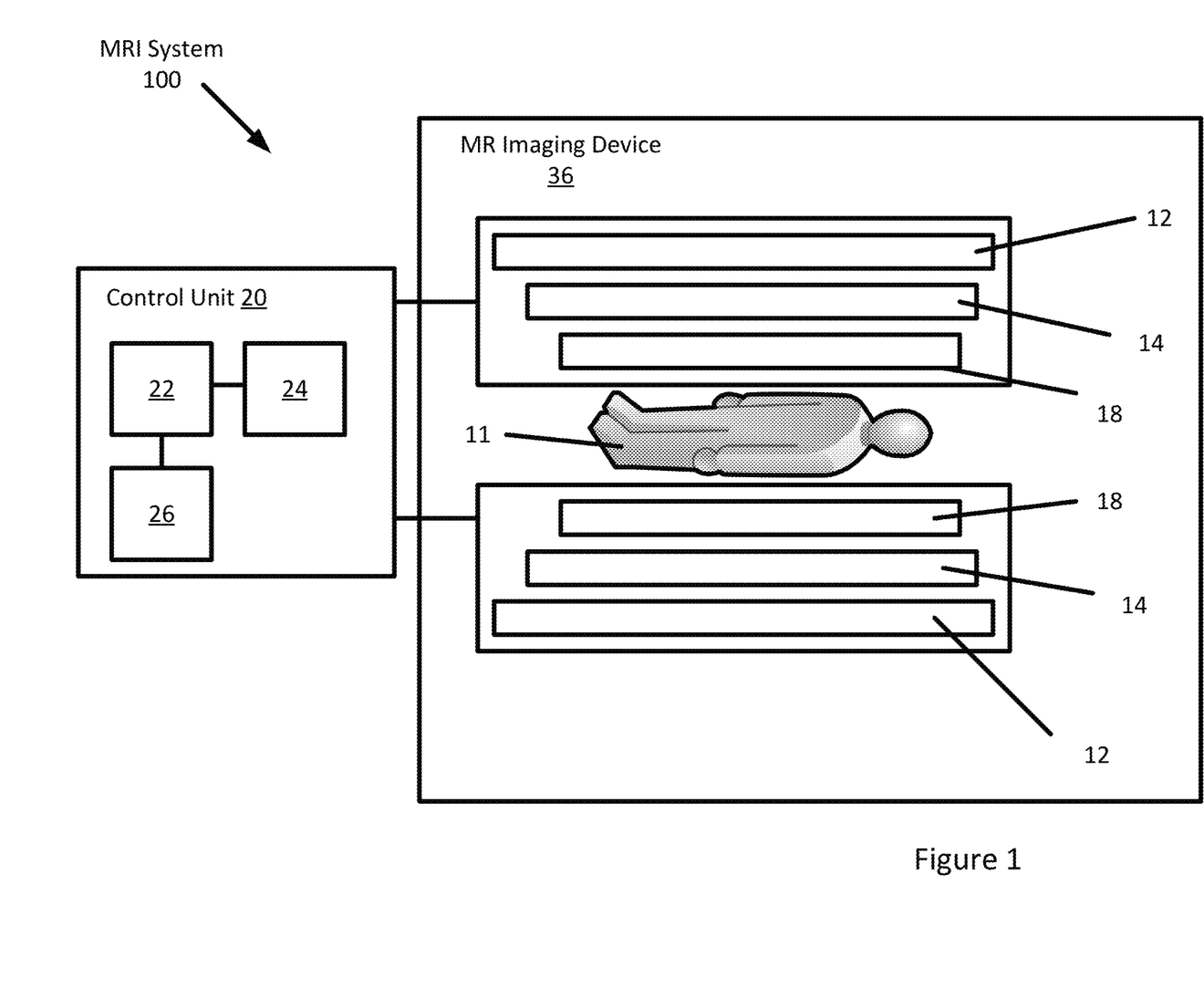
FIG. 1 depicts an example of an MRI system.

FIG. 1 depicts an MRI system 100 for acquisition of frequency domain components representing Magnetic Resonance (MR) image data for storage in a storage array. The MRI system 100 includes a control unit 20 that is configured to process the MR signals and generate images of the body for display to an operator. The control unit 20 may store the MR signals and images for later processing or viewing in a memory 24. The control unit 20 may include a display 26 for presentation of images to an operator. The MR scanning system 100 is only exemplary, and a variety of MR scanning systems may be used to collect the MR data.

In the MRI system 100, magnetic coils 12 create a static base or main magnetic field in the body of patient 11 or an object positioned on a table and imaged. Within the magnet system are gradient coils 14 for producing position dependent magnetic field gradients superimposed on the static magnetic field. Gradient coils 14, in response to gradient signals supplied thereto by a gradient and control unit 20, produce position dependent and shimmed magnetic field gradients in three orthogonal directions and generate magnetic field pulse sequences. The shimmed gradients compensate for inhomogeneity and variability in an MR imaging device magnetic field resulting from patient anatomical variation and other sources.

The control unit 20 may include a RF (radio frequency) module that provides RF pulse signals to RF coil 18, which produces magnetic field pulses that rotate the spins of the protons in the imaged body of the patient 11 by ninety degrees or by one hundred and eighty degrees for so-called "spin echo" imaging, or by angles less than or equal to 90 degrees for "gradient echo" imaging. Gradient and shim coil control modules in conjunction with RF module, as directed by control unit 20, control slice-selection, phase-encoding, readout gradient magnetic fields, radio frequency transmission, and magnetic resonance signal detection, to acquire magnetic resonance signals representing planar slices of the patient 11.

In response to applied RF pulse signals, the RF coil 18 receives MR signals, e.g. signals from the excited protons within the body as the protons return to an equilibrium position established by the static and gradient magnetic fields. The MR signals are detected and processed by a detector within RF module and the control unit 20 to provide an MR dataset to an image data processor 22 for processing into an image. In some embodiments, the image data processor 22 is located in the control unit 20, in other embodiments, the image data processor 22 is located remotely. A two or three-dimensional k-space storage array of individual data elements in a memory 24 of the control unit 20 stores corresponding individual frequency components including an MR dataset. The k-space array of individual data elements includes a designated center, and individual data elements individually include a radius to the designated center.

A magnetic field generator (comprising coils 12, 14 and 18) generates a magnetic field for use in acquiring multiple individual frequency components corresponding to individual data elements in the storage array. The individual frequency components are successively acquired using a Cartesian acquisition strategy as the multiple individual frequency components are sequentially acquired during acquisition of an MR dataset. A storage processor in the processor unit 34 stores individual frequency components acquired using the magnetic field in corresponding individual data elements in the array. The row and/or column of corresponding individual data elements alternately increases and decreases as multiple sequential individual frequency components are acquired. The magnetic field acquires individual frequency components in an order corresponding to a sequence of substantially adjacent individual data elements in the array, and magnetic field gradient change between successively acquired frequency components is substantially minimized.

MRI is particularly sensitive to motion affects primarily due to the prolonged time required for most MR imaging sequences to collect sufficient data to form an image. The time may be far longer than the timescale of most types of physiological motion, including involuntary movements, cardiac and respiratory motion, gastrointestinal peristalsis, vessel pulsation, and blood and fluid flow. The effects of motion include blurring and ghosting in the image. Such effects (e.g. artifacts) in turn may easily lead to misinterpretations in the images and a subsequent loss in diagnostic quality.

Figure 2A:
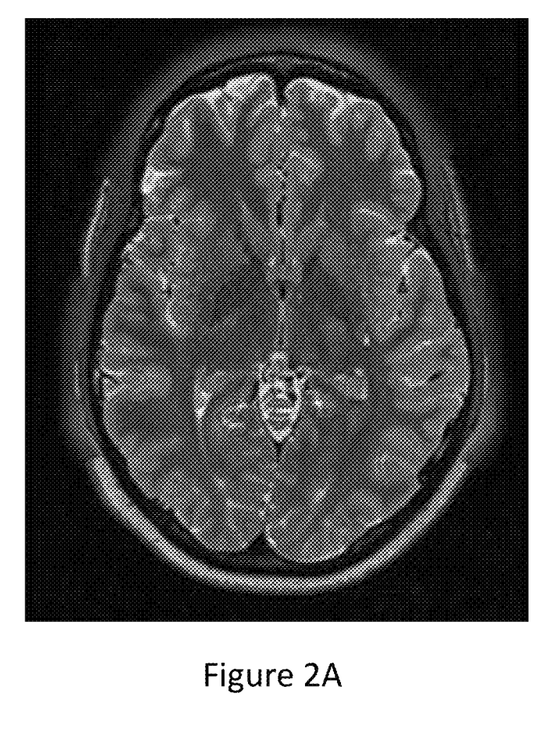
FIGS. 2A and 2B depicts example MR images.
Figure 2B:
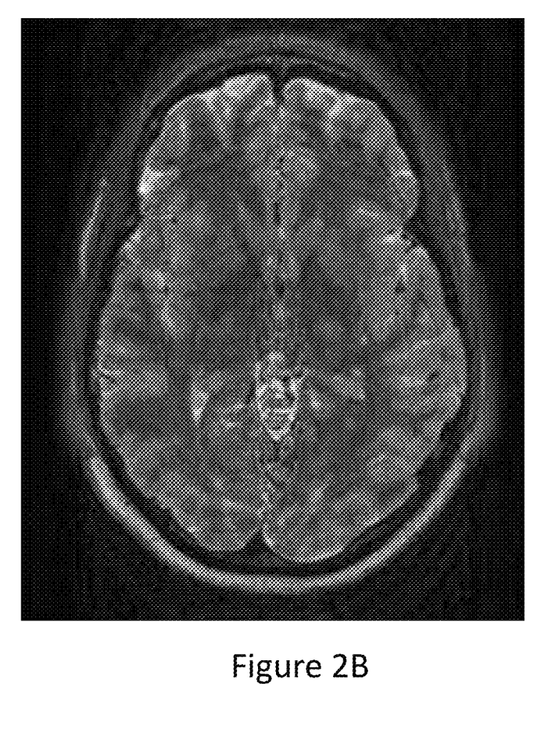

FIGS. 2A and 2B depict an example of motion artifacts in images generated by the system of FIG. 1. FIG. 2A depicts an example of a motion artifact free image. The boundaries between tissues and vessels is well defined. There are no blurring effects. An operator may be able to generate a clear diagnosis from such an image. FIG. 2B, on the other hand, includes several motion artifacts. FIG. 2B includes motion artifacts such as motion blurring and ghosting. The boundaries between tissues and vessels are difficult to identify. The image data for FIG. 2B may have been captured as the patient was moving his or her head. Such an image may not be useful for diagnostics. The patient may need to be rescanned in order to provide an operator with a high quality image. Rescanning is inefficient and may require a patient to undergo a lengthy and unnecessary procedure.

The disclosed image to image networks may be implemented to computationally facilitate processing of medical imaging data and consequently improving and optimizing medical diagnostics. Reduction of motion artifacts in MRI images allows for an increased efficiency and usage of resources. Fewer scans may be used on a patient to provide high quality images to an operator for diagnosis of a medical condition. Few scans may lead to quicker diagnosis, fewer errors, and as such, more efficient use of medical equipment and personal in a hospital environment. Further, fewer scans and more efficient processing may lead to a fewer computational resources used for performing imaging scans.

Figure 3:
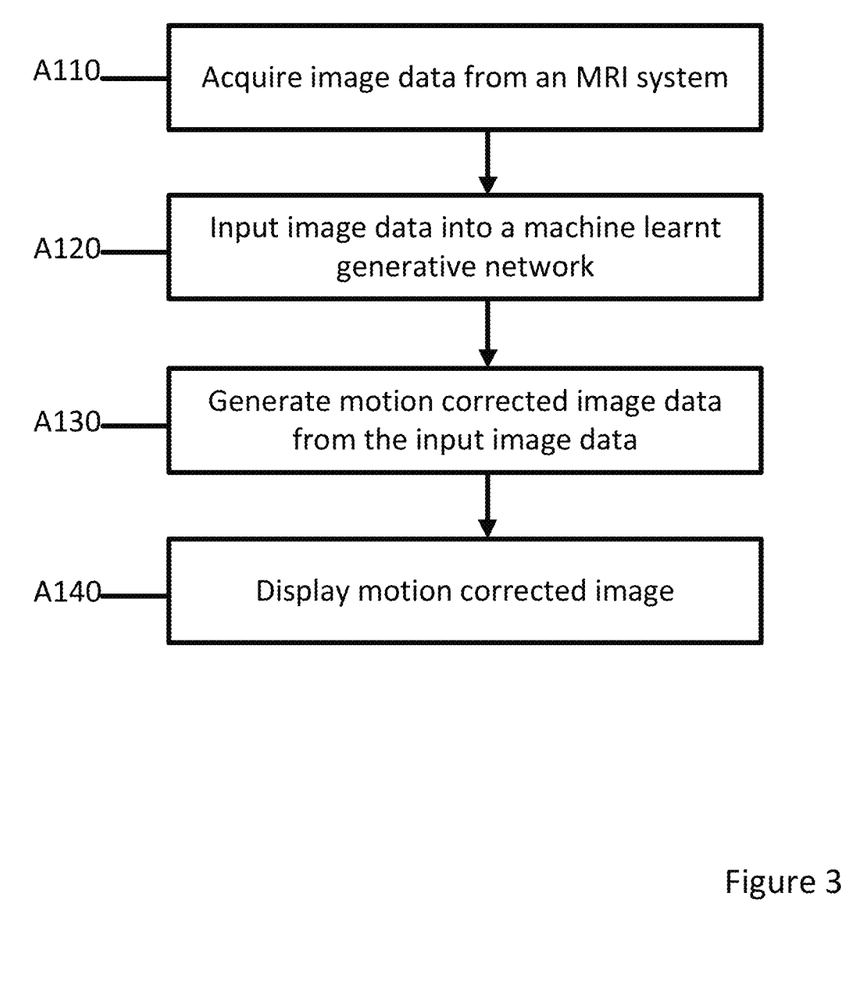
FIG. 3 depicts an example workflow for reducing motion artifacts in magnetic resonance images with an adversarial trained network.

FIG. 3 depicts an example method for reducing motion artifact in a magnetic resonance imaging system. The acts are performed by the system of FIG. 1, FIG. 4, FIG. 5, other systems, a workstation, a computer, and/or a server. Additional, different, or fewer acts may be provided. For example, corrected image data may be stored in the cloud for later or remote diagnosis. The generator network may be trained, e.g. configured, prior to the method of FIG. 3. The acts are performed in the order shown (e.g., top to bottom) or other orders.

At act A110, an object is scanned by the magnetic resonance imaging system to acquire MR data. As depicted and described in FIG. 1 above, the MR data may be acquired using MR scanners. For example, gradient coils, a whole-body coil, and/or local coils generate a pulse or scan sequence in a magnetic field created by a main magnet or coil. The whole-body coil or local coils receive signals responsive to the re-orientation of molecules shifted due to the scan sequence.

The MR data is k-space data or image data. Image data is MR data after Fourier transform into object space. The image data may be at any point after transform, so may be scalar values or may be formatted as RGB values for a display screen. The obtained images may be scan data to be used to generate an image on a display. The obtained images may be data being processed to generate an image, data formatted for display, or data that has been used to display. MR data may be data with no or some image processing.

The MR data may represent volumes. Three-dimensional datasets are obtained. As k-space data, information content may be provided that is responsive to a three-dimensional distribution of locations, but the data itself does not directly represent the locations prior to transform. In alternative embodiments, two-dimensional datasets representing or responsive to tissue in planes are obtained. In other embodiments, sequences of MR data responsive to the same tissue over time are acquired for training.

Alternative methods may be used to acquire the MR image data. The MR image data may be acquired remotely from the server or workstation or may be acquired at a different time, for example, hours or days prior to the processing provided below in Acts A120-A140. The MR image data may be stored locally onsite or offsite, for example in the cloud.

The MR data may include one or more motion artifacts. Motion artifacts may include, for example, blurring, streaking, or shading, that may be caused by patient movement during a scan. Two main type of motion artifacts include random movements that lead to a blurry and noisy image and periodic motion (e.g. blood flow) that creates ghost images.

In an embodiment, only MR data that includes motion artifacts may be processed. MR data, for example, that is motion artifact free may not be processed as there exists a possibility that a generator network may degrade the image. Motion artifact free MR data may refer to MR data that includes no or few noticeable motion artifacts. After the MR data is acquired, a filter may be applied that scores or evaluates an image. A high score, for example, may be assigned to an image with a large amount of image distortion due to motion artifacts. An image quality assessment may be performed to identify whether an image includes motion artifacts or not. Natural images may be highly structured: pixels for different tissues or vessels may include strong dependencies. The dependencies carry important information about the structure of the objects in the image. Quality measures may use the dependencies to identify a level of motion artifacts in the image. For example, in MR data for a head, the MR data may be expected to include clear delimitations between boundaries. Other systems may be used to filter out no or low motion images or, for example, images that may include some motion artifacts, but are still adequate for the diagnosis that is performed. Images that do not require motion correction may bypass the generator network and may be displayed directly to an operator.

At act A120, the MR data is input to a machine learnt generator network trained as an image-to-image network to generate motion corrected (or compensated) image data given motion corrupted input data. The machine learnt generator network is an image-to-image network incorporating the deep learned features for the various units and/or layers of the network and/or the relationships of input features to the output. The collection of individual features forms a feature or feature set for generating a motion artifact reduced image from input MR data.

In an embodiment, the machine learnt generator network is a fully convolutional network. The generator network may further be configured as a DenseNet (Densely Connected Convolutional Networks). A DenseNet connects each layer to every other layer in a feed-forward fashion. For each layer in the DenseNet, the feature-maps of all preceding layers are used as inputs, and the output feature-map of that layer is used as input into all subsequent layers. In the DenseNet, for each layer, the feature maps of all preceding layers are used as inputs, and its own feature maps are used as inputs into all subsequent layers. To reduce the size of the network, the DenseNet may include transition layers. The layers include convolution followed by average pooling. The transition layers reduce height and width dimensions but leave the feature dimension the same. The machine learnt generator network may further be configured as a U-net. The U-Net is an auto-encoder in which the outputs from the encoder-half of the network are concatenated with the mirrored counterparts in the decoder-half of the network. The skip connections prevent the middle of the network from becoming a bottleneck on information flow.

Figure 4:
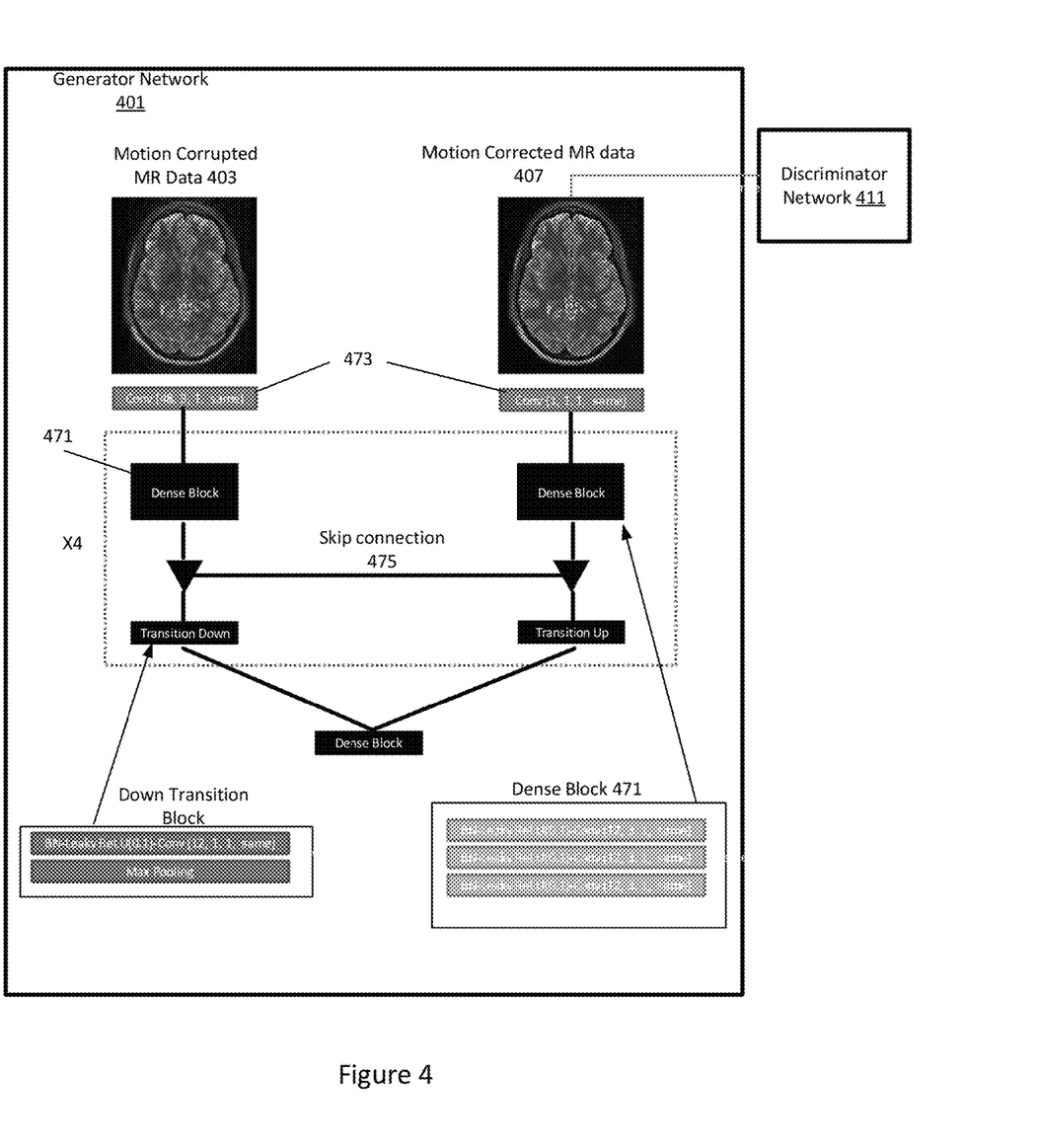
FIG. 4 depicts an example generator network for reducing motion artifacts in magnetic resonance images.

FIG. 4 depicts an example fully convolutional DenseNet configured as a generator network 401 for generating images with reduced motion artifacts. The generator network 401 of FIG. 4 receives motion corrupted MR data 407 and outputs a motion corrected MR data 403 that may be provided to a discriminator network 411. As depicted, the DenseNet includes 48 initial feature-maps, a growth rate of 12, 3 convolutional layers per dense-block and 4 levels of pooling. The DenseNet includes four dense blocks 471 on the transition down on the U-net and four dense blocks 471 on the transition up the other side of the U-net. Skip connections 475 are provided between the transition down and the transition up. Different numbers of dense blocks 471 may be included in the network. Different number of convolution layers 473 or pooling layers may be used. The size and complexity of the DenseNet may be adjusted depending on the size and complexity of the input MR data.

MR data (representing an image) is input into the DenseNet that applies learned values to the MR data. The DenseNet adjusts or outputs new values for pixels in the image to remove or correct for motion artifacts based on learned weights that have been established during training of the DenseNet. The output of the DenseNet is motion corrected MR data. In an embodiment, the DenseNet uses leaky-ReLU activations throughout and a sigmoid final activation. Noisy ReLU's may also be used. Both leaky-ReLUs and Noisy ReLU's may prevent vanishing gradients. Alternative networks may be used. For example, a Resnet may be utilized for the structure of the generator network 401. A ResNet includes residual connections from previous layers to the current one. Input to a layer is obtained by summation of outputs from previous layers.

Figure 5:
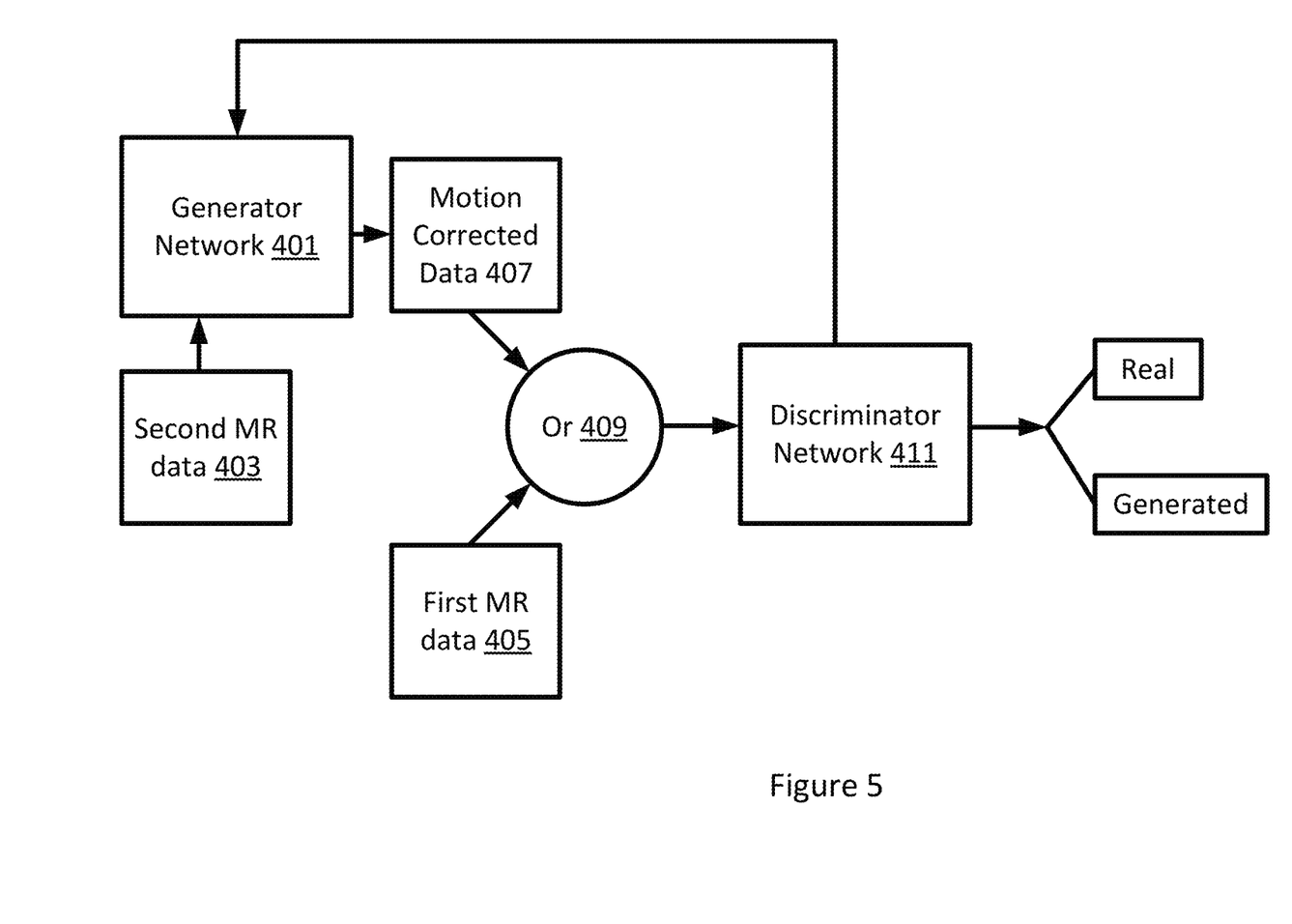
FIG. 5 depicts an example generative adversarial network.

The machine learnt generator network 401 is trained using an adversarial process (e.g. using a generator adversarial network or GAN). FIG. 5 depicts an example GAN. The GAN includes a generator network 401 and a discriminator network 411. The inputs, e.g. training data, for the GAN are first MR data 405 acquired from an MRI that do not include motion artifacts and second MR data 403 acquired from an MRI that do include motion artifacts. The first MR data 403 may be acquired directly from MR scans of patients and identified as not including motion artifacts or may be generated synthetically. The second MR data 403, for example, may be synthesized using any post-processing addition of the contribution of the motion artifact or may be acquired without processing the MR data. In the adversarial process, the generator network 401 may be trained to minimize the sum of two losses: a supervised L1 distance of the generator prediction $E\{x,y\}\|y-G(x)\|$ L1, and an unsupervised adversarial term $E\{x\}\ D(G(x))$. The adversarial term is provided by the discriminator network 411. While the generator network 401 is being trained, the discriminator network 411 is also adjusted to provide better feedback to the generator network 401.

In one embodiment, the training data (e.g. first MR data 405 and second MR data 403) is acquired directly from MR scanners, solely from simulation, or from a combination of the two. For direct MR scanner data collection, multiple acquisitions are performed with and without artifact removal/reduction technique(s) for artifact-free (first MR data) and artifact-contaminated (second MR data) data, respectively. For simulation data, digital phantoms are used, and MR acquisitions are simulated with and without motion artifact sources. In another embodiment, a MR scanner acquires MR data with no or little motion artifacts. Motion artifacts are added to the data with various severities. Since the training session is part of the development and offline, complex signal and physical models may be used to assemble realistic artifacts under various conditions with no influence to online application performance. During the training stage (development and offline), in order to generate training data, more time and resources may be used.

The GAN process uses the training process as a contest between the two separate networks: the generator network 401 that generates motion corrected MR data 407 and the discriminator network 411 that attempts to classify MR data as either motion artifact free MR data 405 or MR data that has been motion corrected by the generator network 401. The OR function 409 randomly feeds the discriminator network 411 with either motion corrected MR data 407 or motion artifact free MR data 405. The discriminator network 411 detects a difference between the two sources and provides feedback to the generator network 401. Based on the feedback, the generator network 401 adjusts one or more parameters. The information from the discriminator network 411 is backpropagated to the generator network 401, so the generator network 401 knows whether or how to adapt its parameters in order to produce output data that may fool the discriminator network 411 (i.e., to attempt to limit the difference between actual motion free and generated motion free MR data). At the end of training, the generator network 401 is able to synthesize an image from the second MR data 403 so that the second MR data 403 are more likely to fool the discriminator network 411 into determining that the generated output is an actual motion artifact free image. During training, the discriminator network 411 may be adjusted in order to get better at distinguishing the true images from generated images.

The discriminator network 411 may use probability distributions of the motion corrected images and the motion artifact free images to classify and distinguish between the two types of images. The discriminator network 411 provides the information to the generator network 401. The information provided by the discriminator network 411 may be in the form of a gradient that is calculated as a function of a comparison of the probability distributions of the images, e.g. comparing a first probability distribution of values for the second motion corrected image with an expected probability distribution of values for motion artifact free images acquired by the magnetic resonance imaging system. The gradient may include both a direction and a slope that steer updates for the generator network 401 in the right direction. After a number of iterations, the gradient directs the generator network 401 to a stable place where the generator network 401 is generating images with probability distributions that are similar to the motion artifact free images. The gradients provided by the discriminator network 411 change as the generator network 401 generates and provides new images. Providing an informative and accurate gradient is key for the training process. If, for example, the discriminator network 411 is too good at distinguishing the generated images from the motion artifact free images, the feedback may not be helpful to the generator network 401. If the discriminator network 411 is provided with bad motion artifact free images or the generator network 401 does not generate good motion corrected images, the feedback may not be helpful.

In another example, the generator network 401 and discriminator network 411 may never converge (e.g. reach a stable point). When the generator network 401 is far from the true data distribution, the discriminator network 411 pushes the generator network 401 towards the true data distribution. At the same time, however, the discriminator network 411 becomes more certain, increasing the discriminator's gradient slope. When the generator network 401 reaches the target distribution, the slope of the discriminator network 411 is largest, pushing the generator network 401 away from the target distribution. As a result, the generator network 401 moves away again from the true data distribution, and the discriminator network 411 changes its slope from positive to negative. After a number of iterations, the generator network 401 and discriminator network 411 may end up with a similar situation as in the beginning of training, only on the other side of the true data distribution. The process may repeat indefinitely and may not converge.

In another example, near a Nash-equilibrium, there is nothing that pushes the discriminator network 411 towards having zero slope on the true data distribution. Even if the generator network 401 is initialized exactly on the target distribution, there is no incentive for the discriminator network 411 to move to the equilibrium. As a result, training is unstable near the equilibrium point.

Another issue that may arise is due to the discriminator network 411 gradients being orthogonal to the data distribution. For example, if the data distribution is concentrated on a low dimensional manifold and the class of discriminators is large enough, there is no incentive for the discriminator network 411 to produce zero gradients orthogonal to a tangent space of the data manifold and hence converge to the equilibrium. Even if the generator network 401 produces exactly the true data distribution, there is no incentive for the discriminator network 411 to produce zero gradients orthogonal to the tangent space. The discriminator network 411 does not provide useful gradients for the generator network 401 orthogonal to the data distribution, and the generator network 401 does not converge.

During the training process, to avoid or limit one or more of the above referenced issues, the discriminator network 411 provides a gradient calculated using a Wasserstein distance. The Wasserstein distance is a measure of the differences between probability distributions. The Wasserstein value may also be referred to as the earth mover's distance. The two probability distributions may be interpreted as two different ways of piling up a certain amount of dirt over the region D. The earth mover's distance is the minimum cost of turning one pile into the other; where the cost is assumed to be amount of dirt moved times the distance by which it is moved.

The training may be repeated for multiple iterations until the networks reach a convergence or the generator network 401 is able to generate an image that is similar to a motion artifact free image. The training may be performed prior to the procedure of FIG. 3. At act A110, the generator network 401 may already be fully trained to generate a motion corrected image.

At act A130, motion corrected MR data is generated by the machine learnt generator network 401. Once the network is trained, the network may be applied. The network with defined or learnt features is used to extract from previously unseen input MR data. The machine-learned generator network 401 uses extracted features from the MR data with or without other information to generate an image. Motion artifacts may be reduced using the trained generator network 401. By input of the previously unseen MR data, the machine-learned generator network 401 outputs MR data with less motion artifact due, in part, to the training using the discriminator with the Wasserstein distance.

The generator network 401 may be periodically updated. For example, online or other updated learning is performed. As new samples are acquired, the learning may be repeated in total or to incorporate the further training data.

At act A140, a motion corrected image is displayed to an operator. The generator network 401 may directly output an MR image. Alternatively, the generator network 401 outputs MR data with less motion artifact than the input MR data. Image processing is applied to generate the MR image from the MR data. The motion corrected image may include an indication the image was corrected. The motion corrected image may identify which types of motion artifacts were present prior to correction. A filter prior to the generator network may evaluate MR data for motion artifacts. The display may allow the operator to provide feedback on whether or not the motion corrected image is accurate or useful. The display may also allow an operator to view the uncorrected image or images.

In an embodiment, multiple generator networks may be used to correct different types of motion artifacts. A first generator network may be trained to correct a first type of motion artifact while a second generator network may be trained to correct a second type of motion artifact. Other types of processing, for example, adding labels or highlight may also be performed prior to or after processing.

As described above, the generator network 401 is trained using an adversarial technique. The training may occur offline or prior to the procedure of FIG. 3. Ground truth data may be collected to train the generator network 401 over a period of time. Motion artifact free MR data may be acquired or generated. Motion affected MR data may be acquired or generated. One or more generator networks may be trained, for example, for different body regions or different types of procedures. Different settings may be used for different diagnostic procedures. Different threshold or quality control mechanisms may be implemented to tailor the generator network 401.

Figure 6:
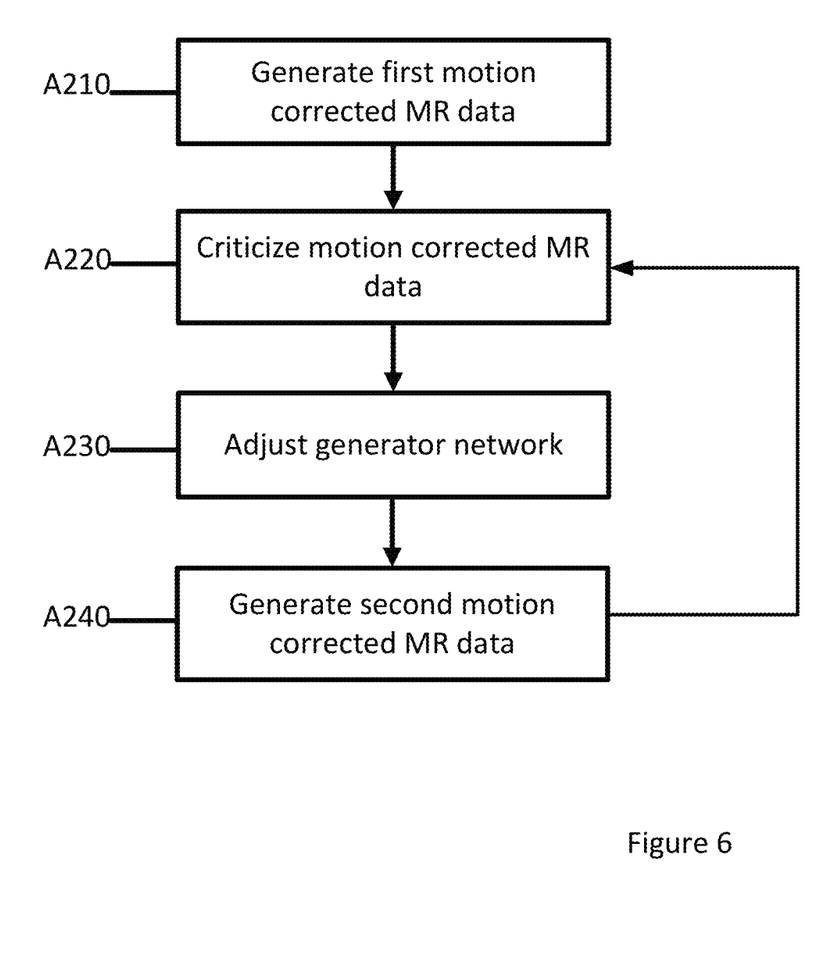
FIG. 6 depicts an example workflow for training a generative adversarial network.

FIG. 6 depicts one embodiment of a method for training a generator network 401 for reducing motion artifacts in magnetic resonance images. The acts are performed by the system of FIG. 1, other systems, a workstation, a computer, and/or a server. The acts are performed in the order shown (e.g., top to bottom) or other orders.

Multiple sets of MR data may be acquired prior to training the generator network 401. Training the generator network 401 may use hundreds or thousands of images of a body region. The images include both motion artifact free and motion corrupted images. The motion corrupted images are used to train the generator network 401 to output motion corrected images. The motion artifact free images are used as ground truth data for the discriminator network 411 to judge the output of the generator network 401.

At act A210, a motion corrected image is generated by the generator network 401 from a motion corrupted image. The generator network 401 may be a DenseNet or other type of network configured to generate a motion corrected image. The generator network 401 inputs a motion corrected image and changes or outputs new values for one or more pixels to correct motion artifacts in the image. The generator network 401 is trained to identify features and patterns in an image. The generator network 401 attempts to alter or replace values for pixels to remove the motion artifact. The identification and alterations are controlled by weights, convolution kernels, or values for layers and nodes in the generator network 401. The generator network 401 may be configured initially with a first set of weights, kernels, or values. As the training proceeds, the weights, kernels, and values may be adjusted so that the generator network 401 performs better. The training is accomplished using a feedback mechanism provided by the discriminator network 411.

At act A220, the motion corrected image is criticized by the discriminator network 411. The discriminator network 411 is randomly input either a motion corrected image or a motion artifact free image (ground truth). The discriminator network 411 attempts to determine from which set the input image belongs. In addition, the discriminator network 411 generates a gradient that is provided to the generator network 401 in order to improve the function of the generator network 401. The gradient is how the discriminator network 411 criticizes the output of the generator network 401. At the start of training, the generator network 401 may generate images that are highly dissimilar from the motion artifact free images. When input into the discriminator network 411, the discriminator network 411 classifies and evaluates the input image. The discriminator network 411 returns the results to the generator network 401 so that the generator network 401 may improve on generating a motion corrected image.

In an embodiment, a convolutional network structure is used for the discriminator network 411. The discriminator network 411 receives an input image, either a motion artifact free image or a generated image synthesized by the generator network 401. The image is propagated through a plurality of convolutional layers with for example, the image dimension down and the channel dimension multiplied. Each convolutional layer is followed by rectifiers. The final layer returns a classification label of (0) for a generated motion corrected image or (1) for a motion artifact free image. Instead of a binary classification label, the final layer may return a classification score. For example, the score may include a range of 0 to 1 with scores closer to 0 indicating a synthetic image and scores closer to 1 indicating a ground truth image.

In an embodiment, the discriminator network 411 may be a patch discriminator network 411. A patch discriminator network 411 splits the classification up into patches of the image. In an example using a 256 pixel by 256 pixel image, a regular GAN maps from a 256×256 image to a single scalar output, that signifies "real" or "fake". A patch discriminator network 411 maps from 256×256 to an N×N array of outputs X, where each $X_{ij}$ signifies whether the patch ij in the image is real or fake. The classification of the entire image may be determined as a function of the outputs X, for example, whether a majority or minority of patches signify that the image is real or fake.

Figure 7:
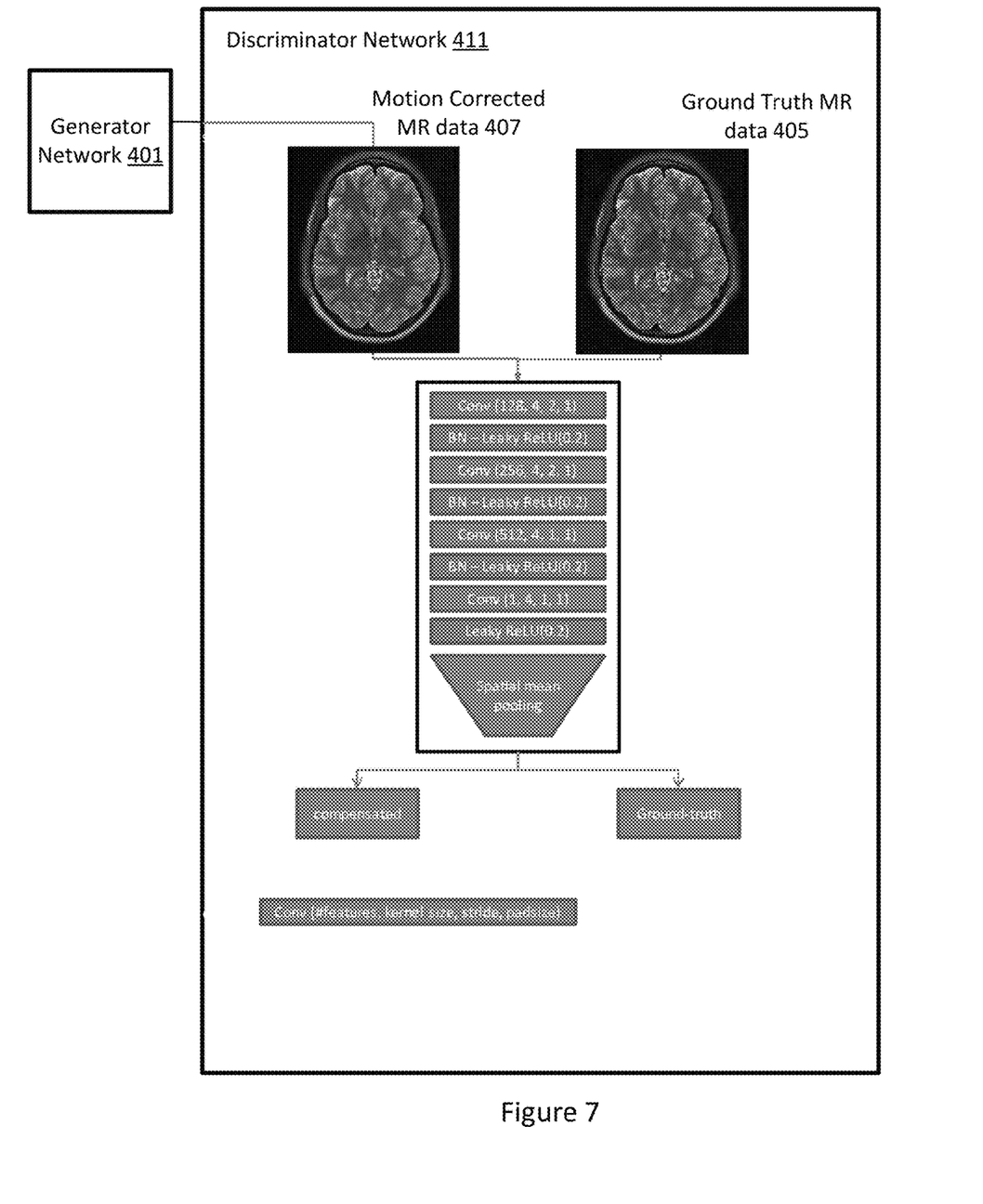
FIG. 7 depicts an example discriminator network for training a generator network for reducing motion artifacts in magnetic resonance images.

FIG. 7 depicts an example discriminator network 411 that includes four convolutional layers. The discriminator network 411 is randomly input either a motion corrected image or a ground truth image and attempts to classify the input. For a patch discriminator network 411, the discriminator network 411 attempts to classify each patch and then aggregates the classification over the entirety of the image.

In the GAN process, the training of the discriminator network 411 may be done simultaneously with training the generator network 401. The training may be accomplished by performing small gradient steps in both the generator network 401 and discriminator network 411 weights. In an embodiment, the discriminator network 411 may be locked while the generator network 401 is trained so as to lower the accuracy of the discriminator network 411. If the generator network distribution is able to match the real data distribution perfectly or within a threshold amount, then the discriminator network 411 will be maximally confused, predicting real images for all inputs. In an embodiment, the discriminator network 411 is trained until optimal with respect to the current state of the generator network 401; then, the generator network 401 is again trained and updated. Alternatively, the training of the discriminator network 411 and generator network 401 are performed at separate learning rates. The discriminator network 411 might not be trained until optimal, but rather may only be trained for a small number of iterations, and the generator network 401 is updated simultaneously with the discriminator network 411.

In order to arrive at an effectively trained generator network 401, the back and forward training of both the generator network 401 and discriminator network 411 needs to be trained so as not to overfit or cause failures. In one common failure mode, the discriminator network 411 overpowers the generator network 401, classifying generated images as fake with absolute certainty. When the discriminator network 411 responds with absolute certainty, there is no information that may be passed back to the generator network 401 to be adjusted. In another common failure mode, mode collapse, the generator network 401 identifies and exploits a weakness in the discriminator network 411. The generator network 401 may begin to generate very similar images regardless of variation in the generator network 401 input. In this scenario, the discriminator network 411 is too easy to fool. Mode collapse may be corrected by strengthening the discriminator network 411, for example, by adjusting the discriminator network training rate.

In an embodiment, the discriminator network 411 uses a Wasserstein value to provide feedback to the generator network 401. The Wasserstein value is a measure of the distance between two probability distributions over a region. The Wasserstein value may also be referred to as the earth mover's distance. The two probability distributions may be interpreted as two different ways of piling up a certain amount of dirt over the region D. The earth mover's distance is the minimum cost of turning one pile into the other; where the cost is assumed to be amount of dirt moved times the distance by which it is moved.

The competition or adversarial relationship between the generator network 401 and the discriminator network 411 may be defined by:

$$\min_{G}\max_{D} \mathbb{E}_{x \sim \mathbb{P}_r}[\log(D(x))] + \mathbb{E}_{\tilde{x} \sim \mathbb{P}_g}[\log(1 - D(\tilde{x}))], \quad \text{Equation 1}$$

where Pr is the data distribution and Pg is the model distribution implicitly defined by x=G(z), z~p(z) where the input z to the generator network 401 is sampled from some simple noise distribution p, such as the uniform distribution or a spherical Gaussian distribution.

The Wasserstein distance W(q, p), is defined as the minimum cost of transporting mass in order to transform the distribution q into the distribution p (where the cost is mass times transport distance). W(q, p) is continuous everywhere and differentiable almost everywhere. The discriminator value function is constructed using a Kantorovich-Rubinstein duality to obtain:

$$\min_{G}\max_{D \in \mathcal{D}} \mathbb{E}_{x \sim \mathbb{P}_r}[(D(x))] - \mathbb{E}_{\tilde{x} \sim \mathbb{P}_g}[D(\tilde{x})], \quad \text{Equation 2}$$

where the cost function for the discriminator network 411 is the set of 1-Lipschitz functions and Pg is the model distribution implicitly defined by x=G(z), z p(z). Under an optimal discriminator, minimizing the value function with respect to the generator network 401 parameters minimizes W (Pr, Pg). The value function results in a critic function that includes a gradient. The weights of the critic function may be clipped to lie within a compact space. The critic function is calculated using the Wasserstein value and provided to the generator network 401.

At act A230, the generator network 401 is adjusted based on the critic function. In addition to the discriminator network 411 preforming the criticism, information may be backpropagated through both the discriminator network 411 and the generator network 401 to determine how to change the generator network's parameters better. The two networks contest one another, the discriminator network 411 attempts to distinguish ground truth images (e.g. motion artifact free image) from the synthesized images, and the generator network 401 attempts to synthesize images that make the discriminator network 411 think the synthesized images are "real". At the end of training process, the generator network 401 outputs synthesized images that are indistinguishable from motion artifact free images. Any motion artifacts are corrected by the generator network 401.

In an embodiment, the training may be done using batches of images from an MRI system. The discriminator network 411 is able to look at an entire batch of images in order to decide whether the images come from the generator network 401 or are ground truth. Batches also may provide a more specific algorithm that works by modelling the distance between a given image and all other images in the same batch. The distances may be combined with the original image and passed through the discriminator network 411. The discriminator network 411 may use the distance measures as well as the image values during classification.

In another embodiment, the generator network 401 and discriminator network 411 may be adjusted manually based on manual annotation of the classification output by the discriminator network 411. For example, an operator that knows the source may manually adjust weights in the discriminator network 411 or may feed specific images into the discriminator network 411 to generate information to be backpropagated to the generator network 401.

Each of the different training mechanisms may incentivize the networks to identify the features of the ground truth images and provide guidance in generating motion corrected images. For example, the generator network 401 may learn that adjacent pixels are likely to have the same color, that certain tissues form different shapes, or that certain clusters indicate a motion artifact that should be corrected. Eventually, the networks may identify many more complex patterns: that there are certain types of backgrounds, objects, textures, that the patterns occur in certain likely arrangements.

At act A240, the generator network 401 generates a new image to be criticized by the discriminator network 411. The process may be repeated hundreds or thousands of times until the discriminator network 411 is unable to tell the generated images from the motion artifact free images at all or for a threshold percentage of samples. To help the process, noise may be added to the feedback from the discriminator network 411 so that the process does not fail to converge.

Different generators may be used for different types of motion artifacts or different object or portions of a body. For example, one generator network 401 may be used for head scans and blurring while another may remove ghosting from heart images. The trained generators may be updated and trained with new images as the images are acquired. Operators may also provide feedback for use in adjusting the generator network 401.

Figure 8:
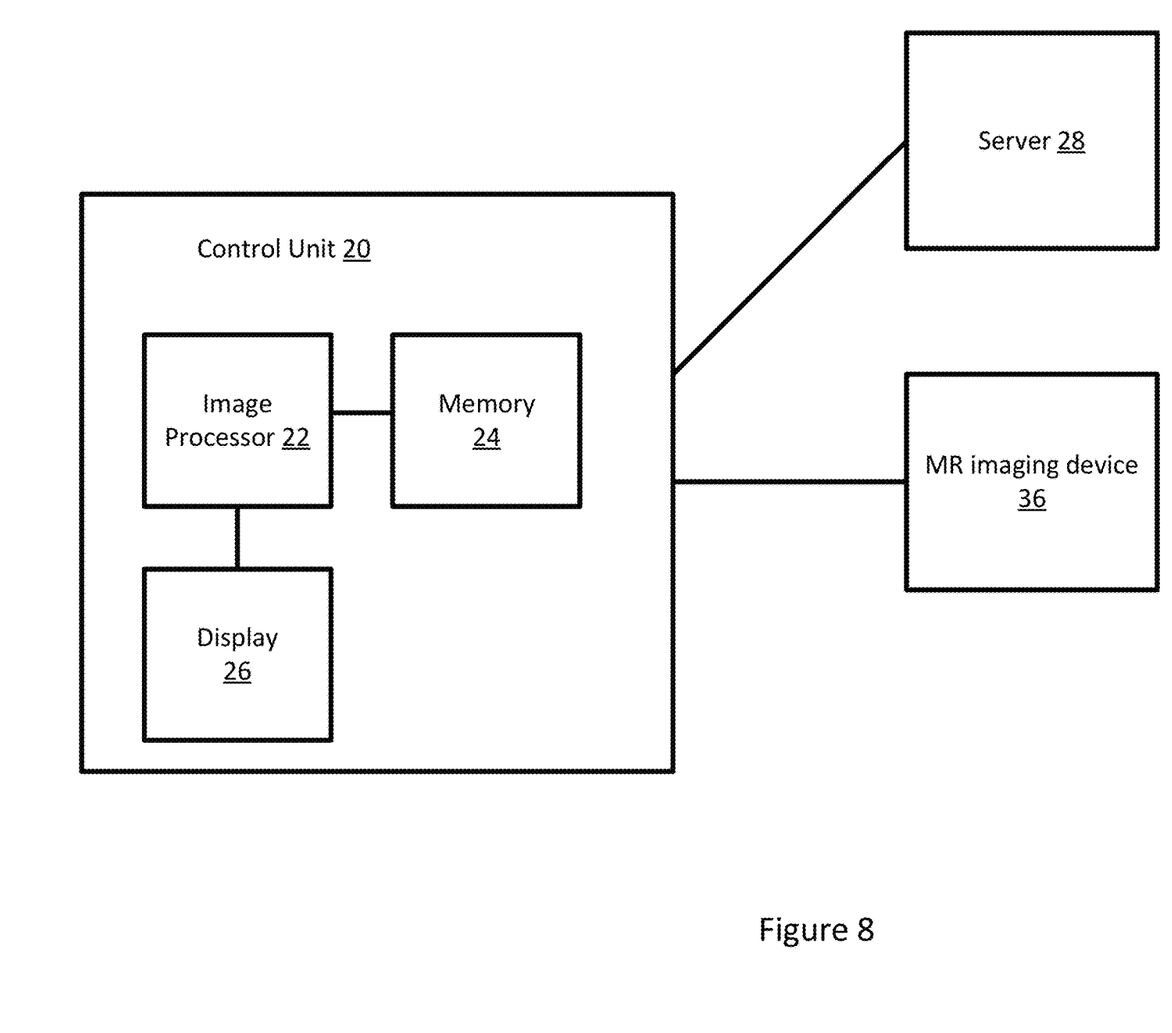
FIG. 8 depicts an example control unit of FIG. 1.

FIG. 8 depicts one embodiment of a control unit for generating motion corrected images. The control unit includes an image processor 22, a memory 24, and a display 26. The control unit 20 may be connected with a server 28 and an MR imaging device 36. Additional, different, or fewer components may be provided. For example, network connections or interfaces may be provided, such as for networking between the control unit 20 and server 28. A workstation with a user interface may be provided for an operator to input data.

The MR imaging device 36 may be similar to the MR imaging device as depicted in FIG. 1. The MR imaging device 36 is configured to acquire MR data that may be processed into one or more images by the control unit 20. The control unit 20 may provide commands to the MR imaging device 36. Alternatively, the MR imaging device 36 may function entirely on its own without any input from the control unit 20.

The image processor 22 (or processor) is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for processing an image. The processor 22 is a single device or multiple devices operating in serial, parallel, or separately. The processor 22 may be a main processor of a computer, such as a laptop or desktop computer, or may be a processor for handling some tasks in a larger system, such as in the MRI system. The processor 22 is configured by instructions, design, hardware, and/or software to perform the acts discussed herein.

The server 28 may be co-located with the control unit 20 or may be located remotely. The server 28 may connect to the MRI system 100 or control unit 20 via a network. The network is a local area, wide area, enterprise, another network, or combinations thereof. In one embodiment, the network is, at least in part, the Internet. Using TCP/IP communications, the network provides for communication between the processor 24 and the server 28. Any format for communications may be used. In other embodiments, dedicated or direct communication is used.

The server 28 may include the processor 24 or group of processors. More than one server 28 or control unit 20 may be provided. The server 28 is configured by hardware and/or software. In one embodiment, the server 28 performs machine learning of the GAN. The server 28 may acquire and the memory 24 may store MR data from multiple different MRI systems.

The processor 24 and/or server 28 are configured to perform the acts discussed above for generating motion corrected images using adversarial training networks. The processor 24 and/or server 28 may access and implement the code stored in memory 24.

The memory 24 may be a graphics processing memory, a video random access memory, a random-access memory, system memory, cache memory, hard drive, optical media, magnetic media, flash drive, buffer, database, combinations thereof, or other now known or later developed memory device for storing data or video information. The memory 24 is part of the control unit 20, part of a database, part of another system, a picture archival memory, or a standalone device. The memory 24 may store image data from the MRI system. The memory 24 may store an instruction set or computer code configured to implement a GAN including a generator network 401 and when training, a discriminator network 411.

The GAN includes an instruction set or computer code for implementing a generator network 401 and a discriminator network 411. In an embodiment, the memory 24 only includes a trained generator network 401. Alternatively, for training, the GAN includes both the generator network 401 and discriminator network 411.

In an embodiment, for the generator network 401, a fully convolutional DenseNet is defined with 48 initial feature-maps, a growth rate of 12, 3 convolutional layers per dense-block and 4 levels of pooling are utilized. Leaky-ReLU activations are used throughout with a sigmoid final activation. The network is trained to minimize the sum of two losses: the supervised L1 distance of the generator prediction $E\{x,y\}\|y-G(x)\|$ L1, and an unsupervised adversarial term $E\{x\}$ $D(G(x))$. D is trained to differentiate a motion-compensated image from the original motion artifact free image. The discriminator network 411 architecture is a patch network with a receptive field of 34. The discriminator network 411 tries to classify each 34×34 patch of the generated image. Scores for all patches are then aggregated via a mean pooling to give a prediction on the whole image. For the discriminator network loss, a Wasserstein objective is used.

The memory 24 or other memory is alternatively or additionally a non-transitory computer readable storage medium storing data representing instructions executable by the programmed processor 22 for correcting motion artifacts in an MRI image. The instructions for implementing the processes, methods and/or techniques discussed herein are provided on non-transitory computer-readable storage media or memories, such as a cache, buffer, RAM, removable media, hard drive, or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code, and the like, operating alone, or in combination. Likewise, processing strategies may include multiprocessing, multitasking, parallel processing, and the like.

The display 26 may be configured to display images to an operator. The display 26 may augment the images with additional information or overlays. The display 26 may be configured to display the images in two dimensions, three dimensions, or, for example, in augmented or virtual reality scenarios.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method for reducing motion artifact in a magnetic resonance imaging system, the method comprising:
   scanning a patient by the magnetic resonance imaging system to acquire magnetic resonance data;
   inputting the magnetic resonance data to a machine learnt generator network configured as a fully convolutional DenseNet, the machine learnt generator network trained as an image-to-image network to generate motion corrected magnetic resonance data given motion corrupted input data;
   generating, by the machine learnt generator network, first motion corrected magnetic resonance data from the input magnetic resonance data; and
   displaying the first motion corrected magnetic resonance data as an image.

2. The method of claim 1, wherein the machine learnt generator network is trained by:
   generating, by the machine learnt generator network, second motion corrected magnetic resonance data from motion corrupted magnetic resonance data;
   determining, using a discriminator network, how likely the second motion corrected magnetic resonance data is motion artifact free magnetic resonance data acquired by the magnetic resonance imaging system or how likely the second motion corrected magnetic resonance data was generated by the machine learnt generator network; and
   adjusting the machine learnt generator network as a function of the determination.

3. The method of claim 2, wherein how likely is quantified by:
   generating a value function as a comparison between a first probability distribution of values for the second motion corrected magnetic resonance data with a second probability distribution of values for motion artifact free magnetic resonance data acquired by the magnetic resonance imaging system.

4. The method of claim 3, wherein the value function is calculated as a function of a Wasserstein distance between the first probability distribution of values and the second probability distribution of values.

5. The method of claim 2, wherein the discriminator network is a patch discriminator network.

6. The method of claim 2, wherein the training further comprises:
   adjusting the discriminator network to make the determination more accurate.

7. The method of claim 2, wherein adjusting comprises:
   altering weights of one or more filters of the generator network.

8. The method of claim 1, wherein the first motion corrupted magnetic resonance data includes one or more motion artifacts.

9. The method of claim 8, wherein the one or more motion artifacts include at least motion blurring.

10. The method of claim 1, further comprising:
    evaluating the magnetic resonance data to determine a level of motion artifacts; wherein magnetic resonance data with low levels of motion artifacts is not input into the machine learnt generator network.

11. A method for training a first neural network to generate motion corrected magnetic resonance data, the method comprising:
    inputting first motion corrupted magnetic resonance data to the first neural network;
    generating first motion corrected magnetic resonance data by the first neural network;
    inputting the first motion corrected magnetic resonance data to a second neural network;
    evaluating, by the second neural network, the first motion corrected magnetic resonance data as a function of a Wasserstein distance between a first probability distribution of the first motion corrected magnetic resonance data and a second probability distribution of a plurality of ground truth magnetic resonance data;
    adjusting the first neural network based on the evaluation;
    inputting second motion corrupted magnetic resonance data to the first neural network; and
    repeating generating, inputting, scoring, and adjusting until the second neural network is unable to distinguish an input motion corrected magnetic resonance data from an image of the plurality of ground truth magnetic resonance data.

12. The method of claim 11, wherein the first neural network is a convolutional DenseNet and the second neural network is a patch network.

13. The method of claim 11, wherein the first motion corrupted magnetic resonance data includes one or more motion artifacts.

14. The method of claim 13, wherein the one or more motion artifacts include at least ghosting.

15. A system for motion artifact correction of magnetic resonance images, the system comprising:
    a magnetic resonance system configured to acquire magnetic resonance data for a patient, wherein the magnetic resonance data includes at least one or more motion artifacts;
    a generator network configured as a fully convolutional DenseNet trained with a discriminator network configured as a patch discriminator and a critic function based on a Wasserstein distance to generate motion corrected magnetic resonance data when the magnetic resonance data includes one or more motion artifacts, wherein the discriminator network provides feedback to the generator network during training as a function of a Wasserstein distance between probability distributions;

a memory configured to store the generator network as trained; and a display configured to display the motion corrected magnetic resonance data from the generator network.

16. The system of claim 15, wherein the one or more motion artifacts include at least motion blurring.

17. The system of claim 15, further comprising:

a filter configured to evaluate the magnetic resonance data for a level of motion artifacts.

* * * * *